United States Patent
Schinzel

[11] Patent Number: 5,491,367
[45] Date of Patent: Feb. 13, 1996

[54] TRANSITION TIME CONVERTER

[75] Inventor: Peter Schinzel, Boeblingen, Germany

[73] Assignee: Hewlett-Packard Company, Palo Alto, Calif.

[21] Appl. No.: 53,533

[22] Filed: Apr. 28, 1993

[30] Foreign Application Priority Data

May 26, 1992 [EP] European Pat. Off. .............. 92108821

[51] Int. Cl.⁶ .................................................... H03K 3/013
[52] U.S. Cl. .......................... 307/106; 307/108; 333/204; 330/296
[58] Field of Search .................................... 307/105–108; 330/296; 333/204, 172, 182

[56] References Cited

U.S. PATENT DOCUMENTS

| | | | |
|---|---|---|---|
| 4,107,621 | 8/1978 | Furutani et al. | 330/296 |
| 4,297,661 | 10/1981 | Stegens | 333/204 |
| 5,157,272 | 10/1992 | Seddon | 307/106 |

FOREIGN PATENT DOCUMENTS 358003  6/1975  Germany.
730578  3/1989  Germany.

Primary Examiner—William M. Shoop, Jr.
Assistant Examiner—Peter Ganjoo

[57] ABSTRACT

A transition time converter for a pulse having steep slopes includes a coil in a series path between an input terminal and an output terminal, as well as a capacitor and a resistor in a shunt path between an input terminal and a reference potential. This transition time converter provides considerably improved reflection characteristics, as compared to prior art transition time converters, while substantially reducing the slopes of the pulses supplied to a load. The coil, capacitor and resistor have values such that the impedance seen by the source looking into the converter is $$R_z = \sqrt{\frac{L}{C}}$$

where $R_z$ is the output resistance of the source, L is the inductance of the coil and C is the capacitance of the capacitor.

11 Claims, 4 Drawing Sheets

PRIOR ART

TRANSITION TIME CONVERTER

FIELD OF THE INVENTION

The present invention relates to a circuit for changing, in particular increasing, the transition time of an electric or electronic pulse, in particular the output pulse of an electronic signal source such as a pulse generator, comprising
- a first reactance element arranged in a shunt path between an input terminal of the circuit and a reference, preferably ground, potential, and
- a second reactance element with a reactance opposite to the reactance of said first reactance element and arranged in a series path between said input terminal of the circuit and an output terminal thereof.

The invention also deals with a related method. (A "reactance element" means essentially an impedance element with imaginary resistance. An "opposite reactance" in the terms used herein means that its imaginary resistance has the opposite sign, but the same absolute value, as the reactance to which it refers.)

DESCRIPTION OF THE PRIOR ART

So-called transition time converters are used to change, namely to increase, the transition time, i.e., the rise time and/or the fall time, of electric or electronic pulses.

An important application of transition time converters of this type is in the field of pulse generators, or, in more general terms, logical signal sources.

Most prior art signal sources of this kind have adjustable rise or fall times. This is an important feature as the transition times of output pulses generated by the signal source have to be adapted to the operating speed of the circuitry which is supplied by the signal source (for example, pulses with unmatched transition time may overdrive the supplied circuitry). Adjustable rise or fall times impose no major implementation problems in case of signal sources with limited bandwidth, say 300 MHz.

However, there is a recent demand for signal sources with extremely wide bandwidth, or, what is effectively the same, for signal sources which are able to generate pulses with very fast transition times. Such signal sources have at bandwidths of 1 GHz, or even 3 GHz and higher frequencies.

It is impossible (or at least extremely costly) to provide adjustable transition times in such wide bandwidth signal sources. Therefore, logical signal sources of this kind usually do not provide transition time adjustability. Instead, they generate pulses with fixed (very fast) rise and fall times.

Adjustment of the transition time is performed in that a multiplicity of external transition time converters are provided for connection to the output jack of the signal source. All of these transition time converters decelerate (increase) the transition times of pulses by a certain, but different, amount. In use, the transition time converter providing adequate transition time deceleration for a particular application is selected and connected to the output of the signal source. The output of the transition time converter then supplies pulses with adequate rise and fall times.

One known possibility to increase the transition time of an output pulse is simply to provide a capacitor between the signal output and a reference output (usually ground) of the signal source. Its capacitance (together with the resistance of the circuit) determines the increase of the transition time. An equivalent solution is the provision of a coil in the signal output path (a "coil" as used herein may also be a simulated coil, e.g., using a gyrator or a circulator, or any other kind of inductance element, like a simple wire which acts as an inductance in high frequency applications).

It will be appreciated that a single capacitor, or a single coil, does not provide the desired symmetric transitions, but rather an exponential output function.

Therefore, most prior art transition time converters used a more sophisticated approach, namely an LC filter (for example, a T-type or π-type low pass filter), in order to increase the transition time. Each of the LC filters is mounted in a separate housing each, and the one suited for a particular application is connected with the output of the signal source.

However, it turned out that even this solution—although suited to provide quite symmetric transitions—does not completely fulfil all needs. In particular, the LC filter causes reflections in response to an incoming step wave. As a match of the LC filter's characteristic impedance to the output impedance of the signal source is only possible at a particular frequency, and a step function, in turn, contains a multiplicity of frequencies, a match of the LC filter can generally not be performed.

The reflections, with an amplitude usually in the amount of 70% of the incoming step wave amplitude, caused various signal integrity problems. For example, a reflected wave can interfere with the next pulse or transition and distort the same. On the other hand, as the output impedance of the signal source can not match with the LC filter's characteristic impedance (see discussion above), the reflections are reflected at the output of the signal source again, resulting in a wave travelling forth and back to distract the original pulse, e.g., its transition.

Consequently, there is a need for an improved transition time converter which avoids the above drawbacks.

SUMMARY OF THE INVENTION

It is thus a major object of the present invention to provide a circuit for changing the transition time of an electric or electronic pulse having a wide bandwidth of the kind described above which does not generate substantial reflections, or has considerably reduced reflections compared to the prior art, in response to an incoming signal, but still provides accurate conversion of the transition time.

According to the present invention, this object is solved by a dissipative resistance element, preferably an ohmic resistor, connected in series with the first reactance, element in the series path.

In a transition time converter destined to increase the transition time, the first reactance element (in the series path) is a capacitor, and the second reactance element (in the shunt path) is a coil (or a simulated coil, see discussion above). The resistor is thus arranged in series with the capacitor in the shunt path.

The capacitor acts as a short circuit for high-frequency components of an incoming signal. Such high-frequency components pass therefore along the capacitor path, i.e., along the shunt path of the circuit. This path also contains the dissipative resistance element mentioned above; the dissipative resistance element is actually the only effective element in the shunt path. Therefore, incoming high-frequency components are fed via this dissipative resistance element. Detailed tests have shown that reflections are drastically reduced, or even completely avoided, by means of this measure.

The dissipative resistance element can be selected to match at least approximately the output impedance of an electronic signal source, or the output impedance of the signal source can be selected to match the dissipative resistance element. This is a particularly advantageous embodiment in which no reflections occur at all because the input impedance of the transition time converter is matched to the output impedance of the signal source.

Likewise, the characteristics of the transition time converter are preferably further improved if the electric or electronic pulse is the output pulse of an electronic signal source with a characteristic output impedance, one of the reactance elements is a coil and the other is a capacitor, and the coil and the capacitor are selected such that they fulfil the equation $$R_z = \sqrt{\frac{L}{C}}$$

wherein $R_z$ is the characteristic output impedance of the electronic signal source, L is the inductance of one of said reactance elements, and C is the capacitance of the other reactance element.

In the most advantageous embodiment, all characteristic impedances are matched, i.e. equal, namely the characteristic impedance of the transition time converter, the dissipative resistance element, the output impedance of the electronic signal source and the input resistance of the element ("the load") connected to the output of the transition time converter. It is particularly be noted that in this case the shunt, as well as the series signal path consist of a reactance and an ohmic resistance, and that these are conjugate-complex quantities (which is an important feature of a preferred embodiment of the present invention). In case of a transition time converter designed to increase the transition time, the reactance in the shunt path may be a capacitor, and the ohmic resistance in the shunt path is the dissipative resistance element. The reactance in the series path may be a coil, and the resistance element in the series path is formed by the input resistance of the load.

In another preferred embodiment of the present invention, a third reactance element of the same type as said first reactance element, and a second dissipative resistance element, both being connected in series between the output of said second reactance element and said reference potential, are provided. (In the case of intended increase of the transition time, the first and third reactance elements may be capacitors, and the second reactance element may be a coil). This makes the structure of the transition time converter symmetrical and thus increases its applicability, while providing a minimal reduction of its reflection characteristics performance. This concept may advantageously further be expanded by the provision of a fourth reactance element of the same type as the second reactance element, arranged in the series path between the output of the second reactance element and an output terminal of the circuit, and a fifth reactance element of the same type as the first reactance element, and a third dissipative resistance element, both being connected in series between the output of the fourth reactance element and the reference potential.

The invention also relates to the physical layout of the transition time converter. In one preferred embodiment, the circuitry is mounted on a printed circuit board or a hybrid, the interconnections between the first reactance element, the second reactance element and the dissipative resistance element are made by means of microstrip lines on the upper plane of the printed circuit board or hybrid, and the microstrip line between the input terminal and the first reactance element is essentially straight.

The use of microstrip lines provides several related advantages such as compact design. This is an important point because the transition time converter is preferably a separate component for connection to the output jack of a logical signal source such as a pulse or data generator. However, there is also another important point: It will be noted that, in the case of an intended increase of the transition time, the high-frequency path runs along the shunt paths, i.e., the capacitors.

The above disclosed preferred design provides basically straight high-frequency paths, such that essentially no internal high frequency (HF) reflections in the transition time converter can occur. This increases the performance of the output pulse considerably.

It will also be understood that this concept may be expanded to the case of a third reactance element, such as a capacitor. In this case, it is preferred to have two basically straight microstrip lines, one connecting an input terminal of the converter with the first reactance element (e.g., capacitor), and the other connecting the third reactance element (preferably also a capacitor) with an output terminal of the converter.

In another advantageous embodiment of the present invention, the circuitry is mounted on a printed circuit board or a hybrid with metallized reference potential back plane, the interconnections between the first reactance element, the second reactance element and the dissipative resistance element are made by means of microstrip lines on the upper plane of the printed circuit board or hybrid, and the dissipative resistance elements are arranged at or near the edge of the printed circuit board or the hybrid.

This design provides an easy and space-saving connection of the dissipative resistance elements to reference potential (preferably ground), wherein possible internal reflections are avoided. The metallized back plane establishes a stable reference potential and thus increases the accuracy and performance of the circuit further.

In order to increase handling efficiency and to shield the transition time converter against electromagnetic radiation, the circuit is, in another preferred embodiment of the invention, mounted in a separate package (preferably a metallized or metallic casing), for connection to the output of an electronic signal source.

The present invention also relates to a method of changing, in particular increasing, the transition time of an electric or electronic pulse, in particular the output pulse of an electronic signal source such as a pulse generator, comprising the steps of:

feeding the electric or electronic pulse to a first shunt reactance element connected in series with an ohmic resistance element which is, in turn, connected with a reference potential, and feeding the electric or electronic pulse further to a second reactance element with a reactance opposite to the reactance of the first reactance element and arranged in a series path between an input terminal of the circuit and an output terminal thereof.

It is understood and expressly noted that the present invention relates to all useful and novel combinations of the above disclosed features, whether alone or in any other or arbitrary combination.

BRIEF DESCRIPTION OF THE DRAWINGS

The invention will now be explained, by means of a non-limiting example, with reference to the accompanying drawings, in which.

DETAILED DESCRIPTION OF THE PREFERRED EMBODIMENTS

Figure 1A:
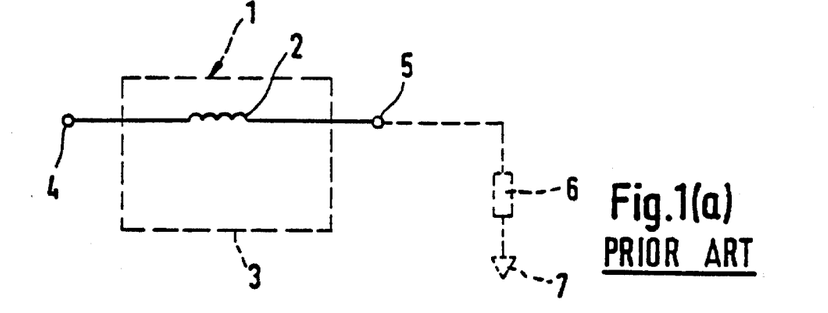
FIGS. 1a to 1d are circuit diagrams of various prior art transition time converters.

FIG. 1a is a circuit diagram of a very simple exemplary prior art transition time converter suited to increase the transition time so a pulse developed across load 6 has an appreciably longer transition time than a pulse derived from a source at terminal 4. The transition time converter, generally outlined as 1, consists basically of a series coil 2 which is connected between the source at terminal 4 and load 6 at terminal 5 incorporated in a housing (indicated by dotted line 3). An input terminal 4 is connected with the output of a signal source which generates fast, but not adjustable edges or transitions. An output terminal 5 of the transition time converter is connected with a load (indicated by dotted symbol 6). The second terminal of load 6 is connected with a reference potential, preferably ground terminal 7. Coil 2, being an inductive impedance, establishes a relatively high impedance with respect to high-frequency components of the source at terminal 4, as is well known in the art. The coil therefore increases the transition time of an incoming (positive or negative) edge of a pulse derived from a source at terminal 4.

A transition time converter of this type is particularly suited for adaptation of a logical signal source with fast, but unadjustable transition times to logic circuitry requiring slower edges. For this purpose, a multiplicity of transition time converters of the type shown in FIG. 1a is provided, each with a different inductance of the coil. The user may simply select the converter with the inductance providing adequate transition time conversion for his particular application circuit, and connect the corresponding transition time converter with an output jack of his signal source.

Figure 1B:
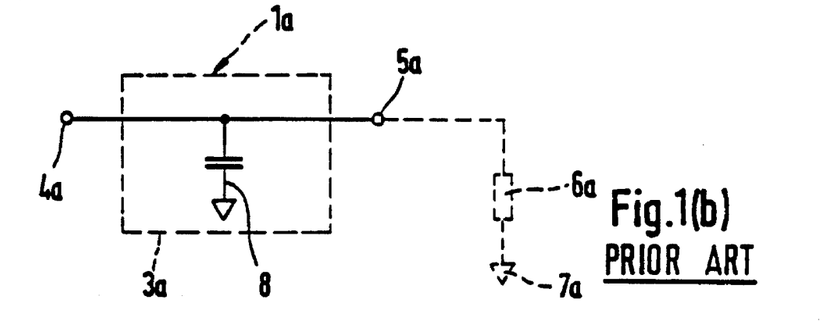

It will be appreciated that the circuit shown in FIG. 1a does not provide very symmetric conversion of an edge, as the output voltage of coil 2 is an exponential function which can, for practical purposes, only be regarded as piecewise linear. The same applies to the second prior art solution shown in FIG. 1b which uses shunt capacitor 8 connected in shunt with terminals 4a and 5a, instead of coil 2 (the other reference numbers of FIG. 1a have been kept in FIG. 1b, but with an additional "a" after the corresponding reference numbers).

Figure 1C:
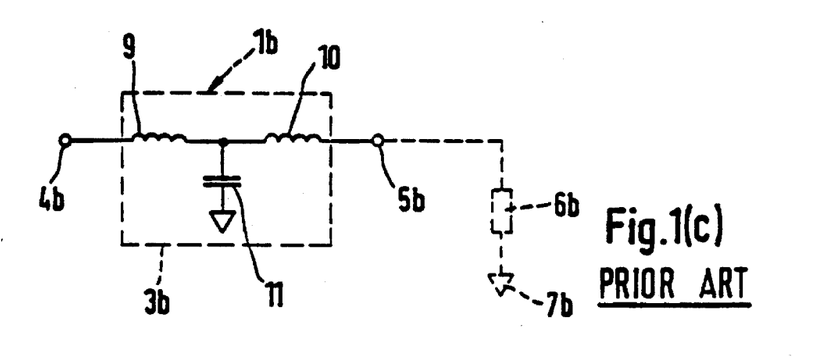

FIG. 1c is a circuit diagram of a more sophisticated approach of a transition time converter according to the prior art. Basically, the transition time converter 1b consists of two series inductors 9 and 10, as well as a shunt capacitor 11. Those skilled in the art will note that the LC components of transition time converter 1b are essentially wired as a conventional low pass filter in a basic T-configuration.

The characteristics of transition time converter 1b as an LC filter improves considerably the characteristics of the output pulse, in particular in terms of linearity. However, the LC filter does still cause considerable reflections at its input terminal.

Figure 5:
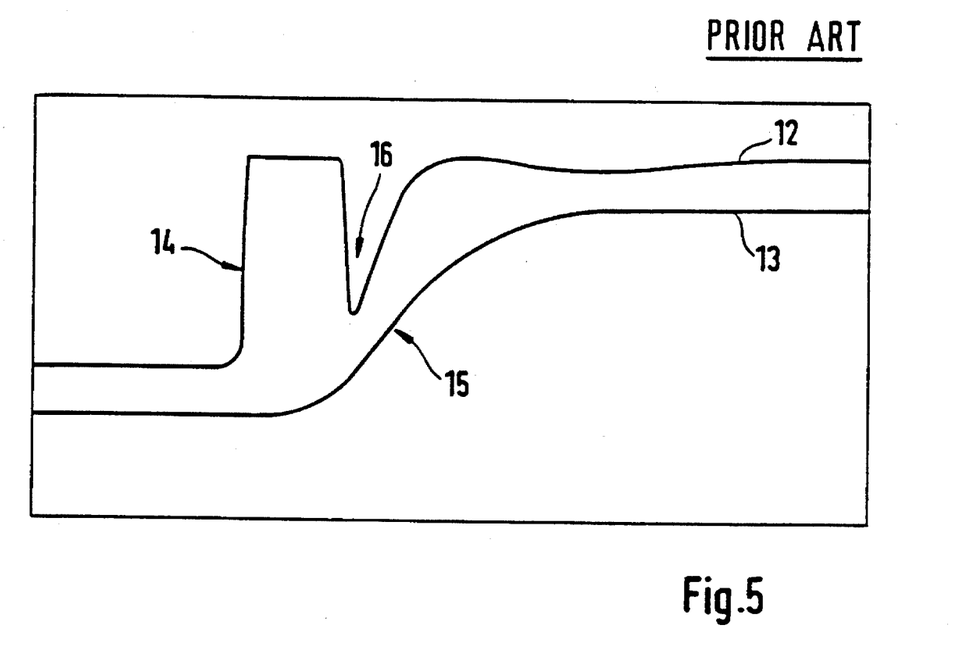
FIG. 5 is a timing diagram relating to a prior art transition time converter and illustrating the transmitted, as well as the reflected wave in case of an incoming pulse.

Reference is particularly made to FIG. 5 which depicts a timing diagram of the voltage 12 at the output of a voltage source feeding input terminal 4b, as well as the voltage 13 at output terminal 5b, of transition time converter 1b in FIG. 1c (the horizontal axis indicates time, and the vertical axis voltage). The diagram of FIG. 5 is based on an actual recording with an oscilloscope with a time domain reflectometer.

Steep positive going leading edge transition 14 is the voltage transition generated by the signal source at terminal 4b. This steep edge is adequately transformed into a relatively smooth gradual transition 15 of output voltage 13 at terminal 5b. However, a reflection occurs at the output terminal 4b of the signal source, the reflection is indicated by the steep negative going transition followed by a positive going more gradual transition and is indicated by reference number 16 (the reflection is delayed with respect to edge 14 because the diagram of FIG. 5 has been recorded directly at the output of the signal source). The reflection 16 disturbs the output voltage of the signal source and may superimposed with the next transition, thus disturbing the same. Even worse, the reflected wave may be reflected at the output terminal of the signal source again, resulting in a wave travelling forth and back which may, in turn, affect even the original transition.

Figure 1D:
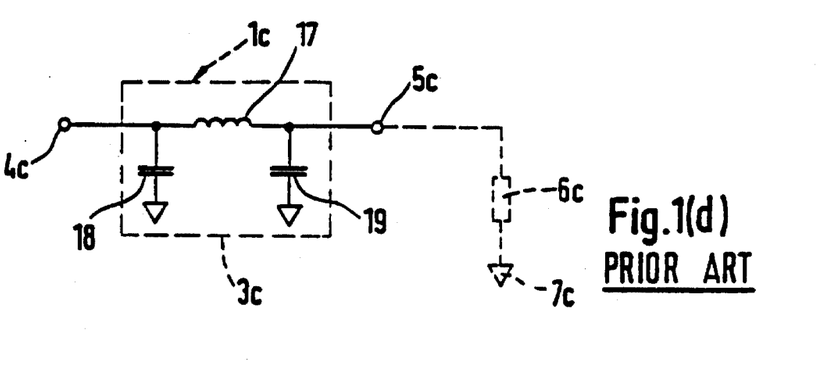

Another prior art approach is depicted in FIG. 1d. The transition time converter 1c shown in FIG. 1d uses also a low-pass LC filter; however, the low-pass is wired in basic π-configuration and consists of series inductor 17, as well as shunt 18 and 19. The operational characteristics of transition time converter 1c correspond to those of converter 1b in FIG. 1c.

Figure 2:
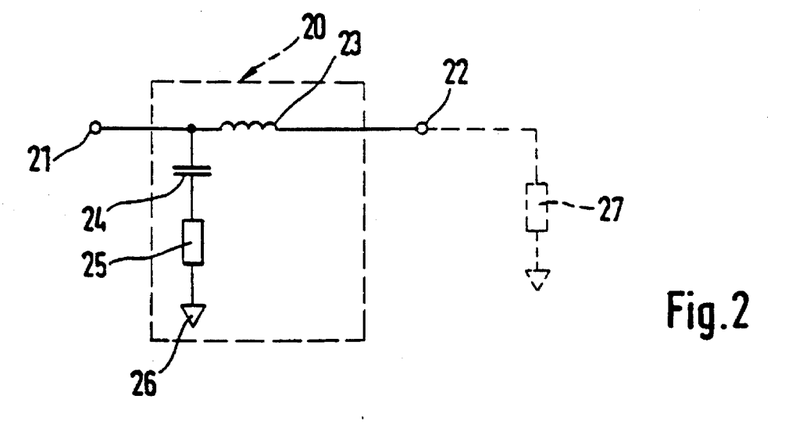
FIG. 2 is a circuit diagram of a first embodiment of the present invention.

A first embodiment of a transition time converter according to the present invention is shown in FIG. 2. Reference number 20 relates to the converter as a whole. The respective input and output terminals are labeled as 21 and 22.

The new transition time converter consists basically of a series inductor 23, connected between terminals 21 and 22 and a shunt branch including the series combination of capacitor 24 and an ohmic resistor 25. Capcacitor 24 and resistor 25 are connected in series, and across input terminal 21, at the output of a signal source, and with ground terminal 26 (or another reference potential). The load 27 indicated in dotted lines, is connected between output terminal 22 and the reference potential at ground terminal 26.

All of the components in the circuit of FIG. 2 are impedance matched. In particular, inductor 23 and capacitor 24 are adapted to the output impedance of the signal source connected to input terminal 21; i.e., they are selected such that they fulfil the equation $$R_Z = \sqrt{\frac{L}{C}}.$$

wherein $R_Z$ is the characteristic output impedance of the signal source, L is the inductance of coil 23 and C is the capacitance of capacitor 24.

Likewise, the input impedance of load 27 is matched to the characteristic impedance of the transition time converter, as well as to the output impedance of the signal source. It is common in the art to choose all of these impedances as 50Ω.

Further, resistor 25 is selected such that It fulfils the equation $$R = R_Z = \sqrt{\frac{L}{C}}.$$

This selection is optimal with respect to reflections, i.e. selecting R (the resistance of resistor 25) according to the above equation avoids any reflections at input terminal 21. This can be easily seen from the following consideration:

The input impedance of transition time convertor 20 (i.e. the impedance looking from terminal 21 into converter 20 and including load 27, having resistance $R_Z$) is, in complex notation, $$R_{in} = \frac{\left(\frac{1}{j\omega C} + R\right)(j\omega L + R_Z)}{\frac{1}{j\omega C} + R + j\omega L + R_Z}$$

wherein $R_{in}$ is the input inductor of the converter, R is the resistance of resistor 25, $R_Z$ is the input impedance of load 27 (which has been selected equal to the output impedance of the signal source), C is the capacitance of capacitor 24 and L is the inductance of coil 23.

If we demand that the input impedance is equal to the characteristic impedance, i.e., $R_{in}=R_Z$, and if further the reactances are impedance matched such that $$j\omega L + \frac{1}{j\omega C} = 0,$$

then the original equation is simplified to $$R_Z = \frac{\frac{L}{C} + j\omega LR - j\omega LR_Z + RR_Z}{R + R_Z}$$

This leads to the equation $$R = \frac{R_Z^2}{j\omega L} - \frac{\frac{L}{C}}{j\omega L} + R_Z$$

$$= \frac{R_Z^2}{j\omega L} - \frac{R_Z^2}{j\omega L} + R_Z$$

$$= R_Z.$$

That is, the resistance of resistor 25 has to be selected equal to the output impedance of the signal source, in order to obtain optimum reflection characteristics.

If we regard the parallel paths constituted by (1) the series combination of capacitor 24 and resistor 25, and (2) inductor 23 and input impedance 27, respectively, we note that the two impedances in the two paths are the conjugate-complex to each other, i.e., the amounts of the (real) ohmic resistances are equal, and the imaginary parts have the same absolute value, but different signs.

Figure 3:
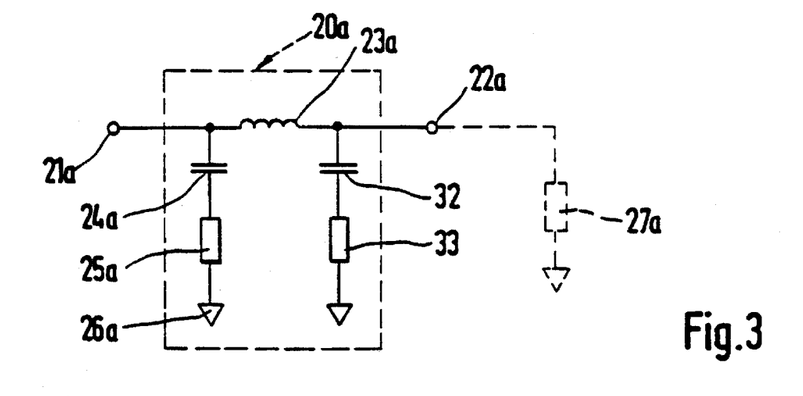
FIG. 3 is the circuit of a second embodiment.

Another, more sophisticated embodiment of the transition time converter according to present invention is shown in FIG. 3. Components or items which are identical to the circuit in FIG. 2 have been assigned the same reference numbers, but with an additional "a".

One will note that two additional components have been introduced in the embodiment of FIG. 3, namely capacitor 32 and resistor 33 connected in series with each other to form a branch shunting load 27a. The values of capacitor 32 and resistor 33 are identical to capacitor 24a and resistor 25a, respectively. The purpose of additional components 32 and 33 is to make the structure of the FIG. 3 transition time converter symmetrical or reciprocal such that it does not matter which side of the transition time converter is used as the input, or the output, respectively, and further to increase the linearity of a transition. Under certain circumstances, performance of the transition time converter—in terms of its reflection characteristics—may be slightly decreased, as compared to the embodiment of FIG. 2; however, symmetry may sometimes be a more important consideration.

Figure 4:
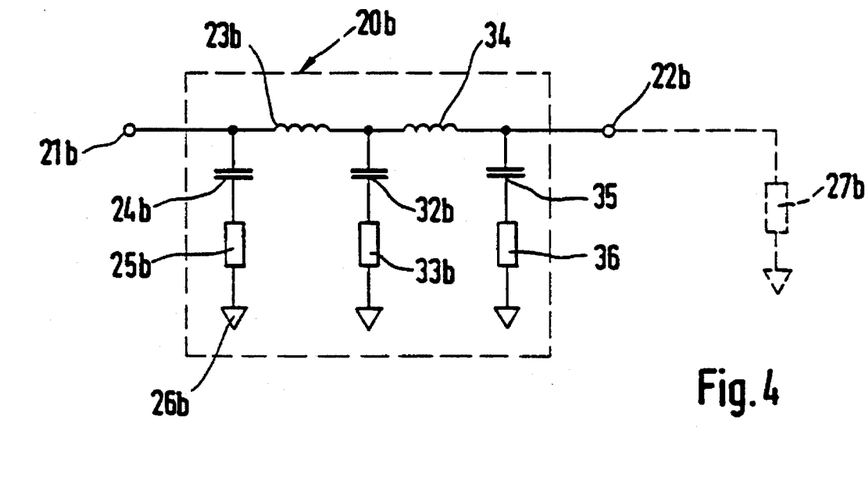
FIG. 4 is a circuit diagram of a third embodiment of the present invention.

A further embodiment of a transition time converter 20b, which provides even more linear transitions, is shown in FIG. 4. In this embodiment, an additional inductance 34, an additional capacitor 35, and an additional resistor 36 are provided. Inductors 23b and 34 are connected in series between terminals 21b and 22b and have a tap between them connected to the shunt branch including capacitor 32b and resistor 33b. Capacitor 35 and inductor or coil 36 are connected in series to form a branch shunting output terminal 22b. The inductance of coil 35 is equal to the inductance of coil 23b; similarly, the capacitance of capacitor 35 is equal to the capacitance of capacitors 24b and 32b, and the resistance of resistor 36 is equal to the resistance of resistors 25b and 33b. It will be appreciated that further inductances, capacitors and resistors may be added, in the same scheme as shown in FIG. 4, in order to obtain improved transfer characteristics of the transition time converter.

Figure 6:
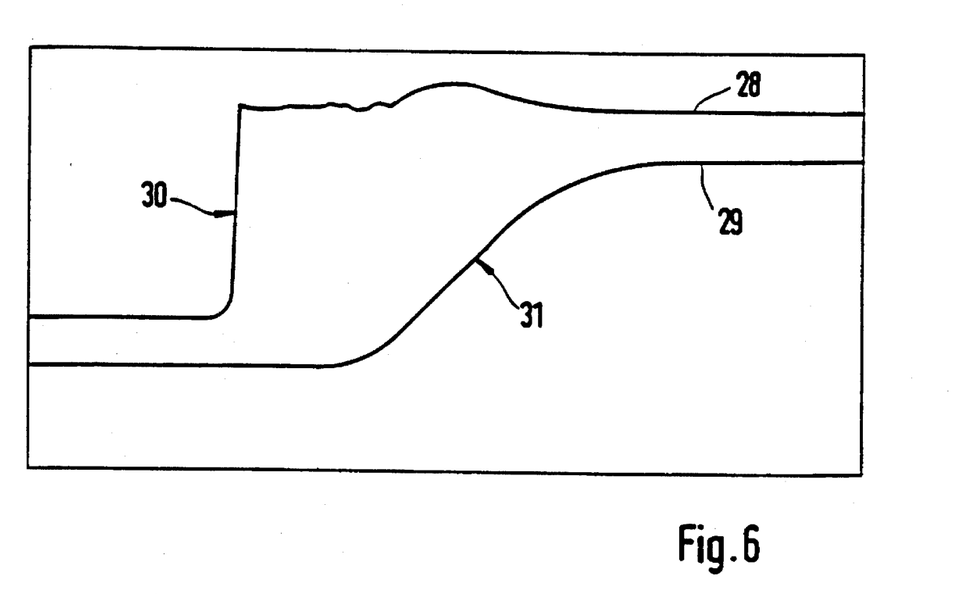
FIG. 6 is a similar timing diagram illustrating the effects of the present invention.

The diagram of FIG. 6 depicts traces of signal amplitude vs. time actually recorded with the new transition time converter (specifically, the circuit of FIG. 4) in a similar representation as FIG. 5. Reference number 28 relates to the pulse generated by a signal source at terminal 21b, and reference number 29 designates the output pulse of the transition time converter across terminal 22b. Edge 30 of the incoming pulse is a very steep and fast (40 ps) positive transition. This transition is transformed into a slower transition 31 of the output pulse.

It will particularly be noted that no or only minimal reflections (as compared to reflection 16 in FIG. 5) appear in trace 28. Only a small ripple can be observed. Further, even the output pulse 29 shows a smoother transition than in the prior art embodiment.

Figure 7:
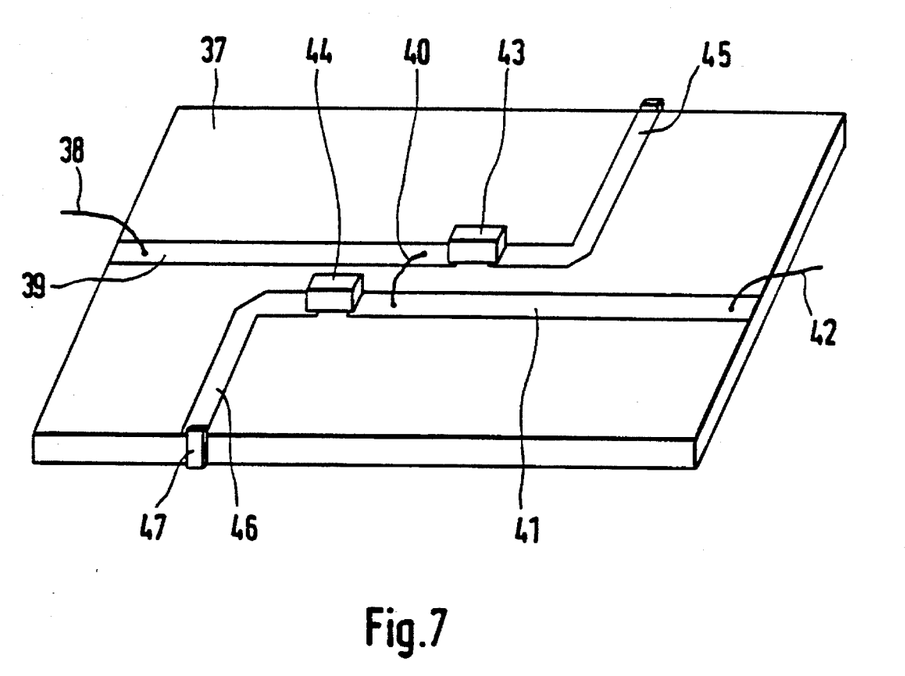
FIG. 7 is a schematic perspective view of a preferred circuit layout for a transition time converter according to the present invention.

FIG. 7 depicts one preferred example of the physical layout of a transition time converter as described hereinbefore in connection with FIG. 3. The circuit is mounted on a printed circuit board or hybrid 37. A signal source (not shown) is connected, via lead 38, with a microstrip line 39. Microstrip line 39 runs straight; in the shown example, it runs parallel to the edges of the PC board or hybrid 37. The inductance or coil in this case is a simple wire 40 connecting microstrip line 39 with a further microstrip line 41. The output signal of the transition time converter is fed, via lead 42, to a load (not shown).

Both sides of inductance 40 are connected, via a respective miniaturized capacitors 43 and 44, with microstrip lines 45 and 46. A resistor 47 connects microstrip line 46 with the back plane of PC board or hybrid 37; this back plane is metallized and connected with a reference potential such as ground. Similarly, microstrip line 45 is connected with the back plane via a resistor (not shown) which is positioned at the sidewall of PC board or hybrid 37. Capacitors 43 and 44, as well as resistor 47, are directly soldered onto the microstrip lines.

The metallized back plane provides an accurate reference potential and thus avoids jitter or ripple of the output pulse. The special position of the resistors helps to save space. Further, it will be noted that the paths for the high-frequency components, namely microstrip lines 39 and 41, run basically straight, such that no high-frequency reflections may occur. The whole circuit shown in FIG. 7 is preferably integrated in a metallized or metallic tube. A multiplicity of transition time converters of different type may be provided, in order to generate different transitions. The degree of increase of the transition time may be determined by appropriate selection of the reactive components, that is, the inductances and capacitors.

In a preferred embodiment such as shown in FIG. 4, the values of the single components are as follows:

$$L_{23b} = L_{34} = 17.5 \ nH$$
$$C_{24b} = C_{35} = 4.7 \ pF$$
$$C_{32b} = 9.4 \ pF$$
$$R_{25b} = R_{36} = 50\Omega$$
$$R_{33b} = 25\Omega$$

These values have been selected for a transition time converter which generates a 1 ns (1000 ps) transition.

I claim:

1. In combination,
   a source of pulses having transitions with steep slopes having certain frequency components, the source having a predetermined output impedance, $R_Z$, between a signal output terminal thereof and a reference potential terminal,
   a load having a predetermined impedance between a pair of load terminals, one of the load terminals being connected to the reference potential terminal, the other load terminal being a signal terminal, the predetermined load impedance being equal in value to $R_Z$,
   a transition time converter network connected between the signal terminals of the source and load, the transition time converter network having series and shunt branch means including opposite type reactance components (a) connected to (i) each other, (ii) the signal output terminal of the source, (iii) the reference potential terminal and (iv) the signal terminal of the load and (b) with inductive, capacitive and resistive values so: (i) the transitions having steep slopes are coupled to the load as transitions with considerably reduced slopes, (ii) there is no substantial coupling of reflections from the matching network to the source of pulses via the signal output terminal in response to the source deriving the transitions with the steep slopes and (iii) the impedance seen by the source looking into the network via the signal output terminal is equal substantially to $R_Z$ for the certain frequency components in the transitions having the steep slopes.

2. The combination of claim 1 wherein
   said series branch means is connected in series between the signal output terminal of the source and the signal terminal of the load, the series branch means including inductor means, and
   said shunt branch means is connected in shunt between the series branch means and the reference potential terminal, the shunt branch means including capacitor means,
   at least one of the branch means including resistive means, the values of the inductor means and capacitor means being such that (a) the absolute values of the reactive impedances thereof as seen by the source looking into the network via the signal output terminal are approximately the same for the certain frequency components in the transitions having the steep slopes, and (b) the polarities of the reactive impedances thereof as seen by the source looking into the network via the signal output terminal are opposite to each other, the value of the resistive means being such that the value of the resistive impedance seen by the source looking into the network via the signal output terminal is equal substantially to $R_Z$.

3. The combination of claim 2 wherein the series branch means consists of N coils connected between the signal output terminal of the source and the signal terminal of the load, where N is an integer having a value of at least one.

4. The combination of claim 3 wherein the shunt branch means consists of N shunt branch circuits, each of said shunt branch circuits including a capacitor and resistor.

5. The combination of claim 3 wherein the shunt branch means consists of M shunt branch circuits, each of said shunt branch circuits including a capacitor and resistor, where M is an integer differing from N by one.

6. The combination of claim 3 wherein the shunt branch means consists of M shunt branch circuits, each of said shunt branch circuits including a capacitor and resistor, where M is an integer one more than N.

7. The combination of claim 6 where N=2.

8. The combination of claim 7 wherein first and second coils are included in said series branch means and have a tap between them, a first of the shunt branch circuits being connected between a terminal of the first coil and the reference potential terminal, a second of the shunt branch circuits being connected between a terminal of the second coil and the reference potential terminal, a third of the shunt branch circuits being connected between the tap and the reference potential terminal, each of the shunt branch circuits consisting of a capacitor connected in series with a resistor, the first and second coils having equal inductance values, L, the first and second branch circuits having capacitors with equal capacitance values, C, and resistors with equal resistance values, $R_Z$, the third branch circuit having a capacitor with a capacitance value of 2C, and resistor having a resistive $$\frac{R_Z}{2}.$$

9. The combination of claim 8 wherein the steep slope of the pulse source has a transition time of 1 ns, the value of L= 17.5 nH, the value of C=4.7 pF and the value of $R_Z$=50 ohms.

10. The combination of claim 1 wherein the inductive and capacitive values, respectively L and C, are such that $$R_Z = \sqrt{\frac{L}{C}}.$$

11. The combination of claim 1 wherein the inductive, capacitive and resistive values, respectively L, C and R, are such that $$R_Z = \sqrt{\frac{L}{C}},$$

and $R_Z$=R.

* * * * *

UNITED STATES PATENT AND TRADEMARK OFFICE
CERTIFICATE OF CORRECTION

PATENT NO. : 5,491,367  
DATED : February 13, 1996  
INVENTOR(S) : Peter SCHINZEL It is certified that error appears in the above-indentified patent and that said Letters Patent is hereby corrected as shown below:

Column 1, line 44, delete "at".

Column 2, line 1, delete the hyphen between "the" and "provision";

Column 2, line 13, delete "each";

Column 2, line 33, change "distract" to --distort--;

Column 2, line 50, delete the second comma.

Column 3, line 31, delete "be".

Column 5, line 13, change "the" to --a--; before "of" insert --diagram--;

Column 5, line 29, after "simple" insert --,--.

Column 6, line 23, after "a" insert --built-in--;

Column 6, line 30, change "." to --;--;

Column 6, line 36, after "may" insert --be--;

Column 6, line 46, after "shunt" insert --capacitors--;

Column 6, line 56, change "Capcacitor" to --Capacitor--;

Column 6, line 59, after "27" insert --,--.

Column 7, line 11, change "It" to --it--.

Column 8, line 6, after "33" insert --,--;

Column 8, line 8, after "to" insert --those of--;

Column 8, line 10, delete "FIG. 3";

UNITED STATES PATENT AND TRADEMARK OFFICE
CERTIFICATE OF CORRECTION

PATENT NO. : 5,491,367

DATED : February 13, 1996

INVENTOR(S) : Peter SCHINZEL

It is certified that error appears in the above-indentified patent and that said Letters Patent is hereby corrected as shown below:

Column 8, line 15, before "performance" insert --the--; before "transition" insert --FIG. 3--.
Column 10, line 43, after "resistive" insert --value of--.

Signed and Sealed this

First Day of October, 1996

BRUCE LEHMAN

Attest:

Attesting Officer

Commissioner of Patents and Trademarks